United States Patent [19]

Judin et al.

[11] Patent Number: 5,178,847
[45] Date of Patent: Jan. 12, 1993

[54] PROCESS FOR PRODUCING CERAMIC RAW MATERIALS

[75] Inventors: Vesa-Pekka Judin, Oulu; Häyhä; Pertti Koukkari, both of Helsinki, all of Finland

[73] Assignee: Kemira OY, Helsinki, Finland

[21] Appl. No.: 442,288

[22] Filed: Nov. 28, 1989

[30] Foreign Application Priority Data

Nov. 30, 1988 [FI]  Finland .................................. 885574
Oct. 26, 1989 [FI]  Finland .................................. 895095

[51] Int. Cl.$^5$ .............................................. G01B 33/025
[52] U.S. Cl. ................................... 423/344; 423/345; 423/346; 423/406; 423/409; 423/440
[58] Field of Search ............... 423/344, 345, 346, 406, 423/409, 440

[56] References Cited

U.S. PATENT DOCUMENTS

| | | | |
|---|---|---|---|
| 4,289,801 | 9/1981 | Galasso et al. | 423/406 |
| 4,399,115 | 8/1983 | Sato et al. | 423/344 |
| 4,416,863 | 11/1983 | Sato et al. | 423/344 |
| 4,521,393 | 6/1985 | Saito et al. | 423/344 |
| 4,604,273 | 8/1986 | Czupryna et al. | 423/344 |
| 4,731,235 | 3/1988 | Schraden, Jr. et al. | 423/406 |

FOREIGN PATENT DOCUMENTS

| | | | |
|---|---|---|---|
| 0874335 | 6/1971 | Canada | 423/346 |
| 2848377 | 12/1980 | Fed. Rep. of Germany . | |
| 52-117899 | 10/1977 | Japan . | |
| 57-175718 | 10/1982 | Japan . | |
| 58-115016 | 7/1983 | Japan . | |
| 59-102809 | 6/1984 | Japan . | |
| 59-174506 | 10/1984 | Japan . | |
| 61-099676 | 5/1986 | Japan | 423/344 |

OTHER PUBLICATIONS

Riley, F. L., *Progress in Nitrogen Ceramics*, Nato ASI Series No. 65, 1983, pp. 121–124.
Mori, M. et al., *Progress in Nitrogen Ceramics*, Nato ASI Series No. 65, 1983, pp. 149–152.
Morgan, P. E. D., *Production and Formaton of $Si_3N_4$ from Percusor Materials*, pp. 11–13, Franklin Institute Research Laboratores, 1974, Distributed by NTIS.
Yamada, T. et al., *Proc. Int. Symp. Ceramic Components for Engine*, Japan, 1983, pp. 333–342.
Okabe, Y. et al., *J. Less-Common Metals*, 1979, 68(1):pp. 29–41.
Fujita, S. et al., *J. Appl. Physics*, 1984, vol. 23, pp. L2688–L270.

*Primary Examiner*—Karl Group
*Assistant Examiner*—Anthony J. Green
*Attorney, Agent, or Firm*—Pennie & Edmonds

[57] ABSTRACT

The invention relates to a process for the production of silicon ceramic whiskers and silicon ceramic powder from silicon fluoride and ammonia or a hydrocarbon, at an elevated temperature. According to the invention, the hydrocarbon or ammonia (4) is decomposed separately at a high temperature into reactive carbon or nitrogen and hydrogen, whereafter the carbon or nitrogen radical thus obtained is further in a gas phase contacted with reactive silicon formed therein from silicon difluoride, in order to deposit finely-divided silicon nitride or silicon carbide out from the gas phase.

18 Claims, 3 Drawing Sheets

PROCESS FOR PRODUCING CERAMIC RAW MATERIALS

TECHNICAL FIELD

The present invention relates to a process for producing silicon ceramic raw materials, particularly silicon nitride and silicon carbide powders or whiskers, from silicon fluoride and ammonia or a hydrocarbon, at an elevated temperature. This invention relates quite particularly to a process in which unstable intermediate forms of gaseous silicon fluorides are used in a high-temperature synthesis between silicon and nitrogen or silicon and carbon.

BACKGROUND ART

Silicon ceramics such as silicon nitride and silicon carbide are the most promising materials for exacting structural ceramic applications. Their specific properties as compared with traditional metal materials include a high strength and resistance to corrosion even at high temperatures, a light weight, and resistance to wear. Compared with other ceramic materials, silicon nitride and silicon carbide also have good thermal shock resistance.

The most important areas of use of silicon ceramic materials at present include small machine components such as cutting bits, machine tools, seals, and bearings. It is forecast that, as manufacturing techniques develop, largescale use will be attained in the 1990s, at which time more and more ceramic components will be used, for example, in automobile engines. It is a prerequisite for this technological leap that ceramic raw materials of a sufficiently high standard can be produced at a competitive price.

At present, silicon nitride is produced commercially mainly by treating silicon powder at a high temperature (1200°–1450° C.) with nitrogen or ammonia (for example F. L. Riley, Progress in Nitrogen Ceramics, Nato ASI Series No. 65, 1983, pp. 121-134). The slow diffusion of nitrogen in silicon makes the process slow. The particle size of the product is usually as such too large for exacting applications, and therefore the commercial product is usually ground. Grinding for its part introduces into the powder non-desirable impurities, which also reduce the usability of the product for exacting applications.

Another prior-art method is to reduce natural quartz by means of carbon to silicon, which is then further immediately nitrided by means of ammonia or nitrogen (for example M. Mori et al., Progress in Nitrogen Ceramics, Nato ASI Series No. 65, 1983, pp. 149-156). The reaction temperature is 1200°–1450° C. The process involves the same problems as does direct nitriding of silicon.

Two types of processes based on the halides of silicon are known. As a result of a gas-phase reaction between silicon tetrachloride and ammonia, silicon nitride powder is deposited at approximately 900° C. by a CVD-type process (for example P. E. D. Morgan, Production and formation of $Si_3N_4$ from precursor materials, Franklin Institute Research Laboratories, 1974, Distributed by NTIS). The process is at the pilot stage, and its primary problem lies in the separation of the ammonium chloride produced as a byproduct.

Yamada et al. (Proc. Int. Symp. Ceramic Components for Engine, Japan, 1983, pp. 333-342) for their part describe a low-temperature process which is based on a reaction between silicon tetrachloride and liquid ammonia. Silicon imide $Si(NH_2)_2$ is formed as an intermediate product, which is converted by calcination at approximately 900° C. to a finely-divided silicon nitride powder. The process is in commercial use in Japan, and it is characterized by high production costs due to the slowness of the process and its numerous steps, the price of the product being therefore high considering large-scale use of the powder.

Processes for producing silicon nitride whiskers are described in, for example, U.S. Pat. Nos. 4,604,273 and 4,521,393. In both these processes, fibrous silicon nitride is formed in a reaction among silica, carbon and nitrogen in the presence of promoters. In the former process, metals such as chromium, nickel and magnesium are added as a promotor; in the latter, fluoride in the form of cryolite is added.

Silicon carbide has been produced traditionally by the carbothermal route by the Acheson process, in which quartz sand is reduced with carbon in an electric furnace. The product is impure considering fine-ceramic uses. By using pure raw materials it is possible to increase the purity of the product [for example JP-77117899 (1977), Toshiba Ceramics Co., Ltd., summarized in CA-88(1978)9157f and DE-2 848 377 (1978), Electroschmelzwerk Kempten], but the product must in any case be ground before the actual production of the ceramic. In carbothermal processes the production temperature of silicon carbide is usually 1500°–2200° C.

By gas-phase processes it is possible to produce a finely-divided powder without a grinding step which introduces impurities. The silicon and carbon sources which have been used include monosilane $SiH_4$ together with a hydrocarbon, e.g. methane, and organochlorosilanes. In JP Patent 59102809 [Toshiba Ceramics Co., Ltd., summarized in CA 101(1984)156401w], an extra fine SiC powder was obtained by thermal decomposition of methyl trichlorosilane $CH_3SiCl_3$ at 1550°–2100° C. The thermal decomposition of tetramethyl silane at 800°–1400° C. also produced silicon carbide (J. Less-Common Metals 68(1979), pp. 29-41]. Plasma has been used in a synthesis between monosilane and methane (for example JP-57175718 (1982), Hitachi, Ltd.). The problem of these processes as compared with the present process is their relatively expensive raw material which is difficult to obtain and which, together with the relatively low yield, makes the processes costly.

Other silicon sources which have been used for silicon carbide include silicon monoxide [DE-3 602 647 (1985), Toyota Motor Co., Ltd.] and silicon tetrafluoride [JP-58115016 (1981), Onoda Cement Co., Ltd., summarized in CA 99(1983)124972g]. Both of the processes have two steps. In the first-mentioned process, SiO was first produced by oxidizing a silicon powder, whereafter the SiO gas was fed into the synthesis together with methane. In the latter process, $SiF_4$ was first reduced with sodium to silicon, which was thereafter mixed with a carbon component (vinyl chloride). The synthesis temperature was 1400° C.

The use of silicon fluoride as the initial material for silicon nitride powder is known, for example, from Japanese Patent 59 174 506, according to which silicon tetrafluoride and ammonia are fed, under a lowered pressure, at a temperature of 900°–1400° C., through a carbon bed. The thermodynamic prerequisites and kinetics of this reaction are, however, disadvantageous and, furthermore, the separation of the product from the carbon bed is cumbersome.

Silicon difluoride $SiF_2$ and its polymeric forms, having the chemical formula $Si_nF_{2n+2}$, where n is an integer which is $\geq 2$, are prior known from the production of thin silicon nitride coatings. One possible initial material mixture is $Si_2F_6+N_2+H_2$, which is described, for example in Japanese Patent 61 99 676 [Chemical Abstracts 105(1986)157791t] and in the publication of Fujita et al. in Japan. J. Appl. Physics 23(1984), pp. L268-L270. A silicon nitride film deposited at a temperature of 300°-350° C. under a low pressure of 0.1 mbar. [Japan. J. Appl. Physics 23(1984), pp. L268-L270]. The use of reactive silicon fluoride for the production of silicon nitride or silicon carbide powder or whiskers is, however, not previously known.

SUMMARY OF THE INVENTION

The object of the present invention is thus to provide a process for the production of finely-divided silicon nitride or silicon carbide, and particularly $Si_3N_4$ or SiC powder or whiskers, from silicon difluoride, which is formed from silicon and silicon tetrafluoride as in step (1) infra, and ammonia or a hydrocarbon, at an elevated temperature, eliminating the disadvantages of prior-art processes and thus accomplishing an economical process for the production of silicon nitride or silicon carbide. Thus, in the process according to the present invention, a highly reactive difluoride product is used as the silicon carrier and as the silicon source in the synthesis reaction. The gaseous intermediate product improves the reaction rate of the formation of nitride and carbide as compared with the direct synthesis of a silicon powder and a nitrogen source or, for example, quartz and carbon, and enables a chemically pure finely-divided powder or a whisker product having a good aspect ratio to be produced.

In the process according to the invention, ammonia or a hydrocarbon is decomposed separately at a high temperature into gaseous radicals which are further in a gas phase contacted with reactive silicon released in it from silicon difluoride, in order to deposit a finely-divided silicon nitride or silicon carbide.

In a manner deviating from prior art production processes, the silicon nitride or silicon carbide is formed as the result of a gas-phase reaction between the nascent silicon from the decomposition of silicon difluoride and the nascent nitrogen or nascent carbon from the decomposition of ammonia or a hydrocarbon; in this reaction the conditions for the formation of the product are ideal.

It is clear for a person skilled in the art that, instead of ammonia and hydrocarbon, it is possible to use any other nitrogen and/or carbon compound which decomposes under the conditions of the process according to the invention, forming in the gas phase reactive nitrogen or carbon, or both together, for example hydrogen cyanide, whereby a mixed ceramic which contains silicon nitride and silicon carbide is obtained.

In the process according to the invention, the temperature of the gas phase can be reduced stepwise to below the dissociation temperature of silicon difluoride, and advantageously down to 1100° C. A highly usable process is achieved when the silicon tetrafluoride produced in the decomposition of silicon difluoride is re-contacted at a high temperature with solid silicon in order to form fresh reactive silicon difluoride in the gas phase. The fluorine can thus be advantageously recycled in the process, whereby its consumption remains very low. The raw material used in the process according to the invention is an advantageously available elemental silicon, for example so-called metallurgical silicon and ammonia gas or a hydrocarbon. The silicon tetrafluoride gas cycled in the process can be prepared, for example, from hydrofluosilicic acid formed in connection with the production of phosphoric acid.

By the process according to the invention, conditions advantageous for the formation of silicon nitride or silicon carbide can be achieved in an easy and simple manner. The reaction between silicon and silicon tetrafluoride is carried out at a temperature of at minimum 1100° C., preferably about 1400° C., and preferably under a lowered pressure, at minimum 0.05 bar. The apparatus required for the implementation of the process is simple, and in it the decomposition of ammonia or hydrocarbons and the forming of silicon difluoride can be carried out in the same space, but in different zones, in which case the reactive constituents are not contacted with each other until after the decomposition of ammonia or hydrocarbons and the formation of silicon difluoride, whereupon, when the temperature is lowered, the silicon difluoride forms reactive silicon which reacts with a nitrogen or carbon radical to form silicon nitride or silicon carbide, which deposits on the reactor walls.

BRIEF DESCRIPTION OF THE DRAWINGS

The invention is described below in greater detail, with reference to the accompanying drawings, in which.

DETAILED DESCRIPTION OF THE PREFERRED EMBODIMENTS

Figure 1:
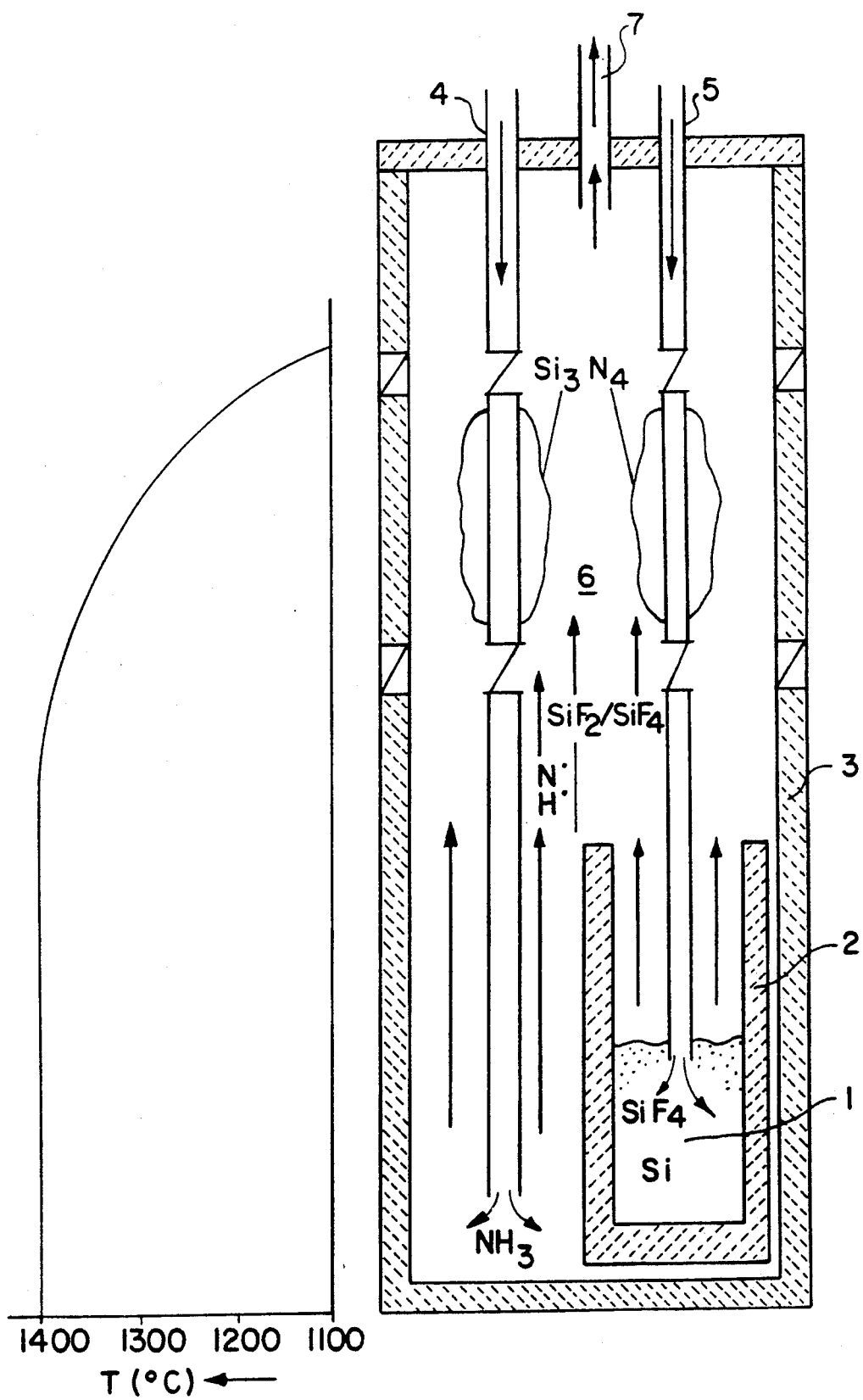
FIG. 1 depicts a cross-sectional vertical representation of an apparatus for the production of silicon nitride whiskers.

In FIG. 1, the closed oblong graphitic reactor is in general indicated by reference numeral 3. Inside the graphitic reactor 3 there is a smaller and upwardly open graphitic crucible 2, in which there is silicon powder 1. A graphite-coated aluminum oxide feeder pipe 5 for silicon tetrafluoride extends into this graphitic crucible 2. Furthermore, an also graphite-coated aluminum oxide feeder pipe 4 for ammonia extends into the lower section of the reactor 3, outside the graphitic crucible. Next to the reactor 3 the drawing also shows its temperature profile, which shows that silicon nitride begins to deposit when the temperature drops from 1400° C. to approximately 1100° C. in the silicon nitride formation and deposition zone 6. In the upper section of the reactor 3 there is, furthermore, an outlet 7 for exhaust gases, which contain mainly silicon tetrafluoride and hydrogen. The silicon tetrafluoride present in the exhaust gases can be returned to the reactor 3 via the feeder pipe 5.

Figure 2:
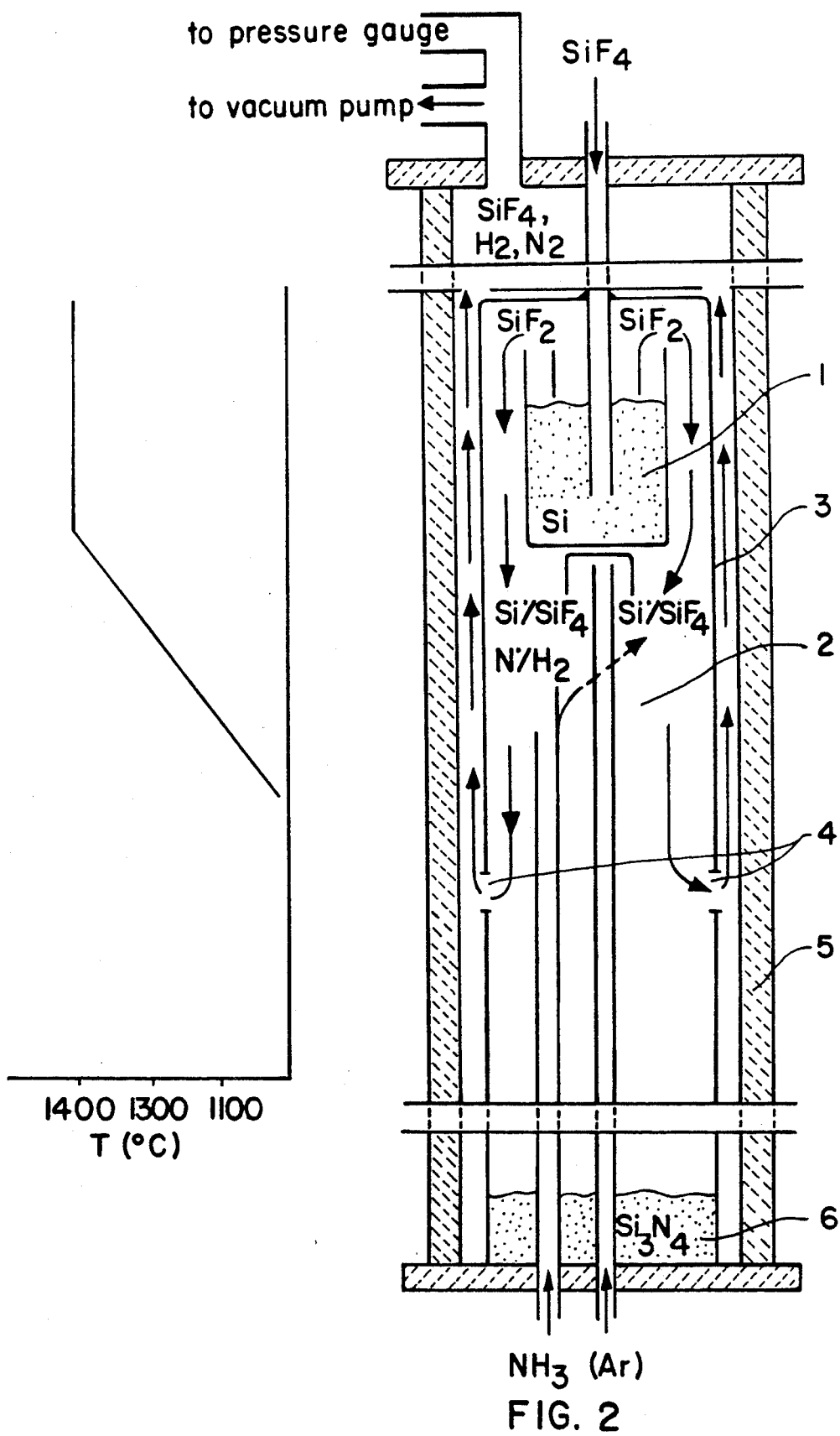
FIG. 2 depicts a cross-sectional vertical representation of an apparatus for the production of silicon carbide powder or silicon nitride powder.
Figure 4:
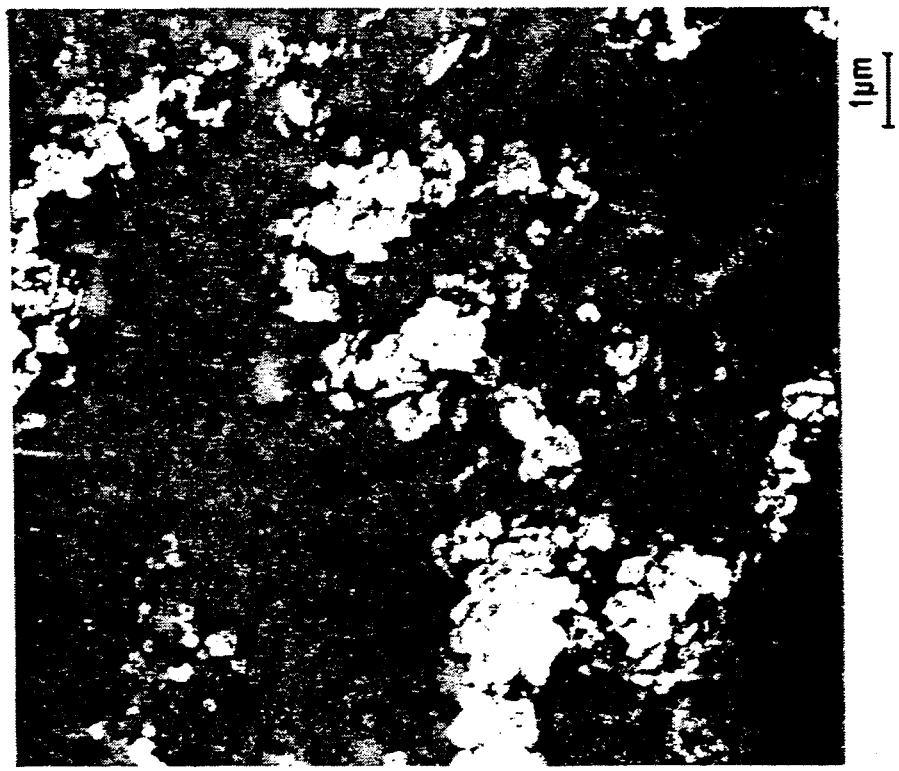
FIG. 4 depicts a scanning electron microscope photograph of silicon nitride powder produced by the apparatus according to FIG. 2, magnified 10,000 times.

The trial apparatus, shown in FIG. 2, for the production of silicon ceramic powder differs from the apparatus of FIG. 1, for example in that the flow arrangements for gases have been altered in order to achieve a longer contact period, and that gravity is made use of in order to collect the product on the reactor bottom 6. Aluminum oxide feeder pipes, which are corroded by the action of silicon difluoride, have been replaced with molybdenum pipes in order to prevent Al contamination of the product. The apparatus has a silicon ceramic powder synthesis zone 2 below the silicon difluoride generator 1, in which case the separation of the product is easy and the yield of each partial step can be determined separately. From the top of the furnace the silicon tetrafluoride gas is fed via the Mo pipe into a graphitic crucible which is equipped with a perforated cover and contains silicon; the crucible constitutes the silicon difluoride generator 1. The crucible is supported by an argon-gas pipe used for the rinsing of the furnace. The closed upper end of the reactor 3 constructed from graphite directs the $SiF_2/SiF_4$ mixture formed in the generator to flow downward. When cooling in the manner indicated by the temperature gradient (see curve on side in the figure), the silicon difluoride dissociates and yields reactive silicon into the gas phase (in the figure, $Si^\bullet$). Simultaneously there is fed, from below, into the synthesis zone 2 ammonia gas when silicon nitride is being synthesized, or hydrocarbon when silicon carbide is being synthesized, decomposing thermally at the high temperature and yielding reactive nitrogen (in the figure, $N^\bullet$), or in the case of silicon carbide, reactive carbon $C^\bullet$. The reaction product falls in part on the reactor bottom 6, part of it remaining on the walls 7 of the hot synthesis zone (temperature range 1100°-1300° C.). The exhaust gases discharge from the reactor through the gas outlets 4 into the space between the graphitic reactor and the aluminum oxide furnace pipe, and further out of the furnace, sucked by a vacuum pump.

The first step of the process thus comprises the forming of reactive silicon difluoride through a known reaction:

$$Si + SiF_4 \rightarrow 2 SiF_2 \qquad (1)$$

The high temperature and the low pressure shift the equilibrium of the reaction to the right. By this reaction, the solid silicon is caused to pass into the gas phase. This reaction (1) takes place in the apparatus according to FIG. 1 in the graphitic crucible 2 and in the apparatus according to FIG. 2 in the $SiF_2$ reactor 1.

The second step, which may take place simultaneously with the first step, but clearly separated from it, comprises the decomposition of the second initial material, ammonia or hydrocarbon, in order to produce reactive nitrogen or carbon. In the experiments of decomposition of ammonia and hydrocarbons it was observed by using a mass spectrometer that ammonia decomposed into radicals of the type $NH^\bullet_n$ (n=0, 1 or 2) and hydrocarbons (e.g. methane) respectively into radicals of the type $CH^\bullet_n$ (n=0, 1, 2 or 3). For the sake of simplicity, reactive nitrogen and reactive carbon are indicated below with the symbols $N^\bullet$ and $C^\bullet$, in which case the decomposition reaction can be presented schematically as follows:

$$NH_3 \rightarrow N^\bullet + 3 H^\bullet \qquad (2a)$$

or, in the case of silicon carbide $$CH_x \rightarrow C^\bullet + x H^\bullet \qquad (2b)$$

where $N^\bullet$, $C^\bullet$ and $H^\bullet$ represent nascent reactive nitrogen, carbon and hydrogen. The keeping of the ammonia and silicon tetrafluoride feeds separate from each other is necessary in order to prevent the formation of addition compound $2NH_3SiF_4$. The decomposition of ammonia is carried out in the apparatus of FIG. 1 in the lower section of the reactor 3 and in the apparatus of FIG. 2 in the ammonia feeder pipe.

In the third step the reactive silicon difluoride formed in the first step is broken down by lowering the gas temperature so that the decomposition reaction of $SiF_2$ starts:

$$2 SiF_2 \rightarrow Si^\bullet + SiF_4 \qquad (3)$$

where $Si^\bullet$ represents the released silicon radical.

The decomposition temperature is typically below 1400° C.

The synthesis of silicon nitride or silicon carbide takes place in the fourth reaction step, as reactive silicon and reactive nitrogen or carbon react with each other:

$$3 Si^\bullet + 4 N^\bullet \rightarrow Si_3N_4 \qquad (4a)$$

$$Si^\bullet + C^\bullet \rightarrow SiC \qquad (4b)$$

The silicon nitride or silicon carbide obtained as the product nucleates out from the gas phase and deposits on a suitable deposition surface, for example a graphitic pipe, or falls on the furnace bottom. Depending on the method of implementation of the process, the product obtained is silicon nitride whiskers, silicon nitride powder or silicon carbide powder. Reactions (3) and (4) take place in the silicon nitride or silicon carbide formation and deposition zone 6 (FIG. 1) or in the synthesis zone 2 (FIG. 2).

The following examples illustrate in greater detail the features characteristic of the process.

EXAMPLE 1

Reference Example 8.8 g of silicon powder, average particle size 30 μm (Merck) was weighed in a trial arrangement according to FIG. 1 into the graphitic crucible 2, which was placed in the tubular reactor 3 made of graphite. The tubular reactor for its part was lowered into an 80-mm diameter resistance furnace in such a manner that the crucible 2 was situated in the hot center of the furnace. During the heating, the tubular reactor was rinsed with argon via the graphite-coated aluminum oxide feeder pipe 4.

At 1400° C. the argon flow was closed and was replaced with a nitrogen flow at 0.1 g/min. By means of a vacuum pipe in the exhaust gas line the pressure in the tubular reactor 3 was adjusted to 0.1 bar, whereafter a $SiF_4$ feed at 0.4 g/min was started through the feeder pipe 5. The duration of the run was 66 min, whereafter the $SiF_4$ feed was replaced with argon, the nitrogen flow was closed, and the heating was switched off.

The weight of the crucible 2, which was weighed after the run, had dropped to 5.3 g. On the surfaces of the gas feeder pipes, in zone 6 in FIG. 1, which corresponds to a temperature of 1100°-1200° C. during the run, there had deposited a total of 1.9 g of a shiny grey product, which in a light microscopic examination proved to be composed of needle-like crystals. According to an X-ray diffraction analysis, the product was metallic silicon. Silicon nitride was not found by X-ray diffraction. According to a chemical analysis, the nitrogen content of the product was 0.1% by weight. The example demonstrates the inert character of the diatomic elemental nitrogen under the conditions in question. The result shows, on the other hand, that reaction (1) plays a significant role and that the formed gaseous silicon difluoride yields silicon in accordance with the reverse reaction (3).

EXAMPLE 2

The experiment of Example 1 was repeated by using ammonia instead of nitrogen gas. By feeding the ammonia to a point outside the graphitic crucible 2 which contained silicon it was ensured that the ammonia would decompose before meeting the silicon fluoride, and at the same time the formation of addition compound $2NH_3SiF_4$ was prevented. 5.8 g Si was batched into the crucible, the $NH_3$ feed was 0.3 g/min, the $SiF_4$ flow was 0.6 g/min, and the total pressure was 0.05 bar. The duration of the experiment was 100 min.

The amount of silicon in the crucible 2 after the experiment was 1.7 g. In the deposition zone 6 in FIG. 1, a white, leathery product had accumulated, which detached well from the surface of the gas feeder pipes 4, 5. According to a microscopic examination, at a 216-fold magnification, the product resembled a felt fabric. According to an X-ray diffraction analysis the product was composed of $\alpha$- and $\beta$-$Si_3N_4$ and elemental silicon. The nitrogen content of the product was 30%, which corresponds to 75% silicon nitride.

EXAMPLE 3

The experiment according to Example 2 was repeated at 1350° C. The amount of silicon at the beginning of the experiment was 5.9 g. After the run the amount of silicon remaining in the crucible 2 was 1.0 g. According to X-ray diffraction, the product contained $\alpha$-$Si_3N_4$ and silicon. According a chemical analysis, the product contained nitrogen 25%.

Figure 3:
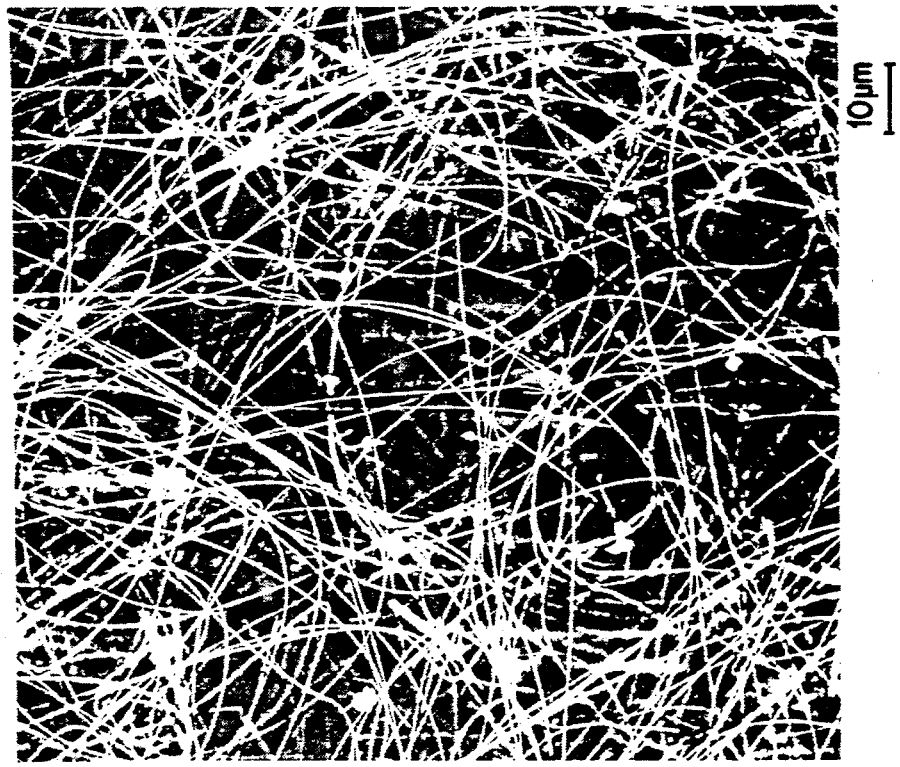
FIG. 3 depicts a scanning electron microscope photograph of silicon nitride whiskers produced by the apparatus according to FIG. 1, magnified 1000 times.

The product of Examples 2 and 3 is shown as a scanning electron microscope photograph in FIG. 3. The product consists of whiskers having a length of approximately 50 $\mu$m and a thickness of approximately 1 $\mu$m, in which case the aspect ratio is 50.

EXAMPLE 4

The production process which is the object of the invention was experimented with for the production of silicon nitride powder by using the apparatus according to FIG. 2.

Silicon powder ground to an average fineness of 6 $\mu$m was batched into the $SiF_2$ generator 1 in such an amount that some of it was left over after the experiment, in order to determine the consumption of silicon on the basis the change in the weight of the crucible. The hottest zone of the furnace, in which zone the $SiF_2$ generator was located, was adjusted to 1400° C., and the furnace was rinsed with argon for the duration of the heating step.

When the run temperature had been reached, the argon flow was closed, and the $SiF_4$ flow into the $SiF_2$ generator was switched on at a rate of 0.7 g/min. The pressure in the reactor was adjusted to 0.05 bar by means of a vacuum pump and a vacuum meter. At the same time the feeding in of ammonia was started at a rate of 0.25 g/min; the level of the feeder pipe in the furnace was 1200° C. The gas discharge holes were at the level of 550° C. The duration of the experiment with these values of the run was 262 min. The pressure in the reactor varied in the experiment within 0.05–0.07 bar.

When the crucible containing silicon was weighed after the run, it was observed that the consumption of silicon in the experiment had been on the average 0.08 g/min. Calculated from this, the degree of utilization of $SiF_4$ in the $SiF_2$ generator was 43%. A total of 29.1 g of reaction product was produced in such a manner that approximately ⅓ was collected from the walls of the synthesis zone and approximately ⅔ from the bottom of the furnace. According to an X-ray diffraction analysis, the product collected from the synthesis zone contained $\alpha$-silicon nitride and silicon. According to an element analysis, the nitrogen content of the product was 36–37%. According to an X-ray diffraction analysis, the product which had fallen on the bottom of the furnace contained $\alpha$-silicon nitride and aluminum fluoride, and its nitrogen content was 30%. The aluminum fluoride was derived from the corrosion of the aluminum oxide pipe under the action of $SiF_2$; the corrosion can be eliminated by a correct reactor design. According to the nitrogen balance, the yield from the synthesis reaction according to Equations (3) and (4a) was 66%.

EXAMPLE 5

The apparatus according to FIG. 2 was experimented with also for the production of silicon carbide powder. A sufficient amount of a silicon powder of an average of 6 $\mu$m was batched into the $SiF_2$ generator, and it was heated to 1400° C. while the argon rinse was on.

At 1400° C. the feeding of silicon tetrafluoride at 0.7 g/min into the $SiF_2$ generator was started, and the pressure in the reactor was adjusted to 0.05 bar. The feeding of propane gas at a rate of 0.25 g/min from the $NH_3$ feeder pipe of FIG. 2 to the level of 1350° C. was started. The gas feeds were on for 72 minutes.

The consumption of silicon by the $SiF_2$ generator was 0.1 g/min, which corresponds to a 53% utilization of the $SiF_4$. A total of 9.8 g of the product was collected from the hot synthesis zone and the bottom of the furnace, at a ratio of 1:2. The product fraction was heat treated for 6 h in the tubular furnace in an air atmosphere in order to burn off the free carbon (soot) which had been produced in the decomposition of propane and was not bound in SiC. An X-ray diffraction analysis showed that the heat-treated samples contained silicon carbide, silicon, and silicon dioxide. The $SiO_2$ had most probably formed at the heat-treatment stage of the products. According to a carbon analysis, the product which was collected from the bottom of the furnace contained carbon 30%, which corresponds to the stoichiometric carbon content in silicon carbide. The C content in the product collected from the synthesis zone was 15%. According to the carbon balance, the yield from the synthesis corresponding to Reactions (3) and (4b) was 17%.

We claim:
1. A process for the production of finely-divided silicon nitride which comprises:
   (a) heating ammonia at a temperature sufficient to decompose said ammonia into monatomic reactive nitrogen;
   (b) reacting solid silicon and silicon tetrafluoride, separately from said ammonia decomposition in step (a), at a temperature sufficient to form silicon difluoride;

(c) producing reactive silicon in the gas phase from said silicon difluoride of step (b); and (d) contacting said reactive nitrogen in a gas phase with said reactive silicon, in order to deposit a finely-divided silicon nitride out from the gas phase.

2. The process according to claim 1, characterized in that the temperature of the gas phase in step (c) is reduced stepwise to below the dissociation temperature of silicon difluoride to decompose said silicon difluoride into said reactive silicon and silicon tetrafluoride.

3. The process according to claim 2, characterized in that said silicon tetrafluoride formed in the decomposition of silicon difluoride is recycled to step (b) for reaction with said solid silicon in order to form fresh reactive silicon difluoride in the gas phase.

4. The process according to claim 3, characterized in that the reaction between said solid silicon and said silicon tetrafluoride is carried out at a temperature of at least about 1100° C., up to a temperature in which said solid silicon is still in solid state.

5. The process according to claims 1 or 2 characterized in that steps (a)-(d) are carried out at subatmospheric pressure.

6. The process according to claim 5, characterized in that steps (a)-(d) are carried out under a pressure of at minimum 0.05 bar.

7. The process according to claim 1 or 2, characterized in that the decomposition of ammonia and the formation of silicon difluoride are carried out in the same space but in different zones.

8. The process according to claim 2 characterized in that the temperature of the gas phase is lowered to about 1100° C.

9. A process for the production of finely-divided silicon nitride which comprises:
(a) reacting gaseous silicon tetrafluoride and solid silicon at an elevated temperature of about 1100° C. to about 1400° C. in order to form reactive silicon difluoride;
(b) decomposing ammonia separately from step (a), in order to produce reactive nitrogen;
(c) reducing the temperature of said reactive silicon difluoride in step (a) in order to form reactive silicon; and
(d) contacting said reactive nitrogen with said reactive silicon to form silicon nitride.

10. A process for the production of finely-divided silicon carbide which comprises:
(a) heating a hydrocarbon at a temperature sufficient to decompose the hydrocarbon into monatomic reactive carbon and hydrogen;
(b) reacting solid silicon and silicon tetrafluoride, separately from said hydrocarbon decomposition in step (a), at a temperature sufficient to form silicon difluoride;
(c) producing reactive silicon in the gas phase from said silicon difluoride of step (b); and
(d) contacting said reactive carbon in a gas phase with said reactive silicon in order to deposit finely-divided silicon carbide out from the gas phase.

11. The process according to claim 10, characterized in that the temperature of the gas phase in step (c) is reduced stepwise to below the dissociation temperature of silicon difluoride to decompose said silicon difluoride into said reactive silicon and silicon tetrafluoride.

12. The process according to claim 11, characterized in that said silicon tetrafluoride formed in the decomposition of silicon difluoride is recycled to step (b) for reaction with said solid silicon in order to form fresh reactive silicon difluoride in the gas phase.

13. The process according to claim 12, characterized in that the reaction between said solid silicon and said silicon tetrafluoride is carried out at a temperature of at least about 1100° C., up to a temperature in which said solid silicon is still in solid state.

14. The process according to claims 10 or 11, characterized in that steps (a)-(d) are carried out at subatmospheric pressure.

15. The process according to claim 14, characterized in that steps (a)-(d) are carried out under a pressure of at minimum 0.05 bar.

16. The process according to claim 10 or 11, characterized in that the decomposition of hydrocarbon and the formation of silicon difluoride are carried out in the same space but in different zones.

17. The process according to claim 11 characterized in that the temperature of the gas phase is lowered to about 1100° C.

18. A process for the production of finely-divided silicon carbide which comprises:
(a) reacting gaseous silicon tetrafluoride and solid silicon at an elevated temperature of about 1100° C. to about 1400° C. in order to form reactive silicon difluoride;
(b) decomposing a hydrocarbon separately from step (a), in order to produce reactive carbon and hydrogen;
(c) reducing the temperature of said reactive silicon difluoride in step (a) in order to form reactive silicon; and
(d) contacting said reactive carbon with said reactive silicon to form silicon carbide.

* * * * *